(12) United States Patent
Nguyen et al.

(10) Patent No.: US 6,875,668 B2
(45) Date of Patent: Apr. 5, 2005

(54) NOTCHED GATE STRUCTURE FABRICATION

(75) Inventors: Khanh Nguyen, Sunnyvale, CA (US); Scott Bell, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 145 days.

(21) Appl. No.: 10/179,824

(22) Filed: Jun. 24, 2002

(65) Prior Publication Data

US 2002/0168842 A1 Nov. 14, 2002

Related U.S. Application Data

(62) Division of application No. 09/706,040, filed on Nov. 3, 2000, now abandoned.

(51) Int. Cl.[7] ................... H01L 21/336; H01L 21/8234
(52) U.S. Cl. ................. 438/386; 438/197; 438/199; 438/286; 438/595
(58) Field of Search ................. 438/197, 199, 438/286, 595, 596, 705, 735, 585, 586

(56) References Cited

U.S. PATENT DOCUMENTS 6,218,252 B1 * 4/2001 Yeo .............................. 438/305
6,417,084 B1 * 7/2002 Singh et al. ................ 438/585

* cited by examiner

*Primary Examiner*—Caridad Everhart
*Assistant Examiner*—Chuong Anh Luu
(74) *Attorney, Agent, or Firm*—Winstead Sechrest & Minick P.C.

(57) ABSTRACT

Aspects for notched gate structure fabrication are described. The notched gate fabrication includes forming spacers of hard mask material on a gate conductor, and utilizing the spacers during etching to form notches in the gate conductor and provide a notched gate structure. In a further aspect, notched gate fabrication includes performing a timed etch of masked gate conductive material to maintain a portion of a gate conductive layer and provide gate structure areas in the gate conductive layer. Anisotropically etching the gate structure areas provides spacers on the gate structure areas. Isotropically etching the portion of the gate conductive layer provides notched gates in the gate structure areas.

10 Claims, 7 Drawing Sheets

NOTCHED GATE STRUCTURE FABRICATION

This application is a divisional of Ser. No. 09/706,040 Nov. 3, 2000 Abandonment.

FIELD OF THE INVENTION

The present invention relates to gate structures for semiconductor devices, and more particularly to notched gate structure fabrication.

BACKGROUND OF THE INVENTION

Two aspects of feature sizes for semiconductor devices, such as processors, are controlled in a lithographic and etch process. The first aspect is a critical dimension of the absolute size of a feature, including linewidth, spacing or contact dimensions. The second aspect is the variation in feature size across the wafer surface as measured by steps of a wafer stepper. Linewidth and spacing measurements are regularly performed to determine the actual sizes of critical dimensions at each masking level of a process.

Linewidth control is affected by many factors including fabrication tools and equipment, process recipes, and raw materials. Critical dimensions are analyzed by measuring fabricated test structures with nominal feature sizes at many positions of a wafer. The measurement results are then plotted as a function of location to determine critical dimension variation.

The critical dimensions of polysilicon gates affect many operating parameters of integrated circuits, but fundamentally the greatest considerations of critical dimensions is speed performance and power consumption of a circuit. The smaller this critical dimension, the faster the operation of the transistor and the integrated circuit as a whole. Too small a polysilicon gate critical dimension, however, results in unacceptably high power consumption and parasitic currents in the transistor. An optimal operating point for this critical dimension is therefore defined by these countervailing effects. Thus, the narrower the distribution of critical dimension values centered about the optimal critical dimension in a lot of wafers, the more high speed, functional circuits are produced. Unfortunately, the critical dimensions resulting from conventional manufacturing methods are rarely optimum, resulting in reduced yield of high performance circuits. Furthermore, the conventional process is very wasteful when process conditions are substandard.

Accordingly, what is needed is a gate fabrication technique that balances critical dimension control and size. The present invention addresses such a need.

SUMMARY OF THE INVENTION

The present invention provides aspects for notched gate structure fabrication. The notched gate fabrication includes forming spacers of hard mask material on a gate conductor, and utilizing the spacers during etching to form notches in the gate conductor and provide a notched gate structure. In a further aspect, notched gate fabrication includes performing a timed etch of masked gate conductive material to maintain a portion of a gate conductive layer and provide gate structure areas in the gate conductive layer. Anisotropically etching the gate structure areas provides spacers on the gate structure areas. Isotropically etching the portion of the gate conductive layer provides notched gates in the gate structure areas.

With the present invention, a balance is achieved for critical dimension control and size considerations. The notched gate structure maintains a large enough print size to support consistent stepper operations with control over variation, while reducing the gate size at a lower contact point to increase the speed of the device. These and other advantages of the aspects of the present invention will be more fully understood in conjunction with the following detailed description and accompanying drawings.

DETAILED DESCRIPTION OF THE INVENTION

The present invention relates to notched gate structure fabrication. The following description is presented to enable one of ordinary skill in the art to make and use the invention and is provided in the context of a patent application and its requirements. Thus, the present invention is not intended to be limited to the embodiment shown, but is to be accorded the widest scope consistent with the principles and features described herein.

Figure 1:
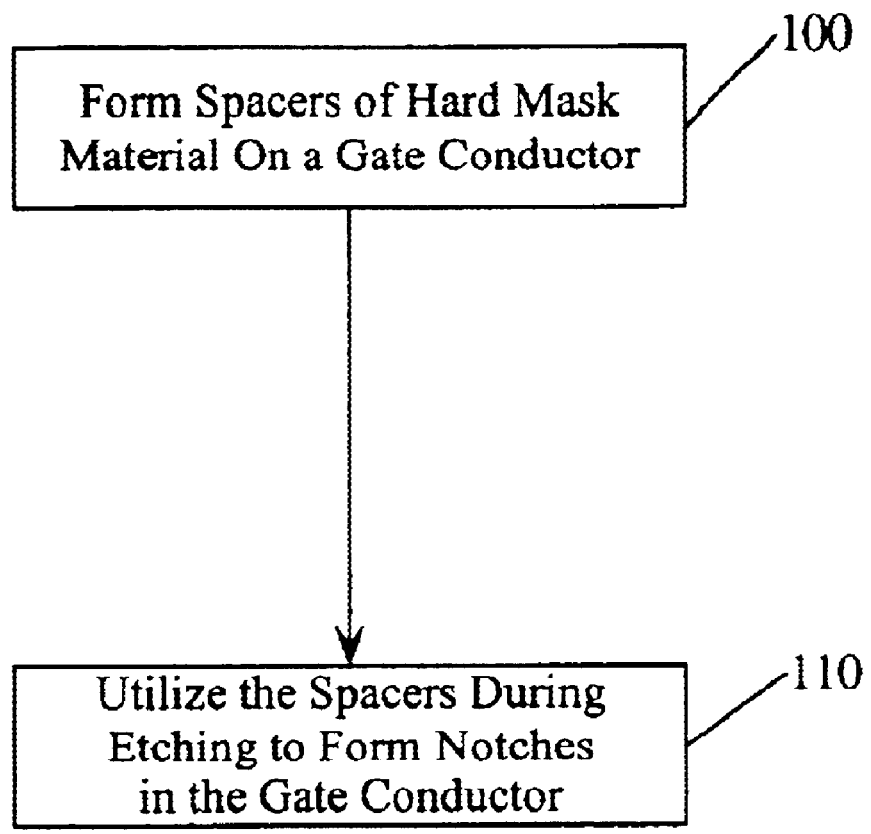
FIG. 1 illustrates an overall block diagram for notched gate structure fabrication in accordance with the present invention.

FIG. 1 illustrates an overall block flow diagram of notched gate structure fabrication steps in accordance with the present invention. As shown in FIG. 1, the fabrication of a notched gated structure includes the formation of spacers of hard mask material on a gate conductor (step 100). The formed spacers are then utilized during etching to form notches in the gate conductor (step 110) to provide a notched gate structure. The processing for a preferred embodiment for these steps is presented hereinbelow with reference to the partial cross-sectional structure diagrams of FIGS. 2, 3, 4, 5, 6, and 7.

Figure 2:
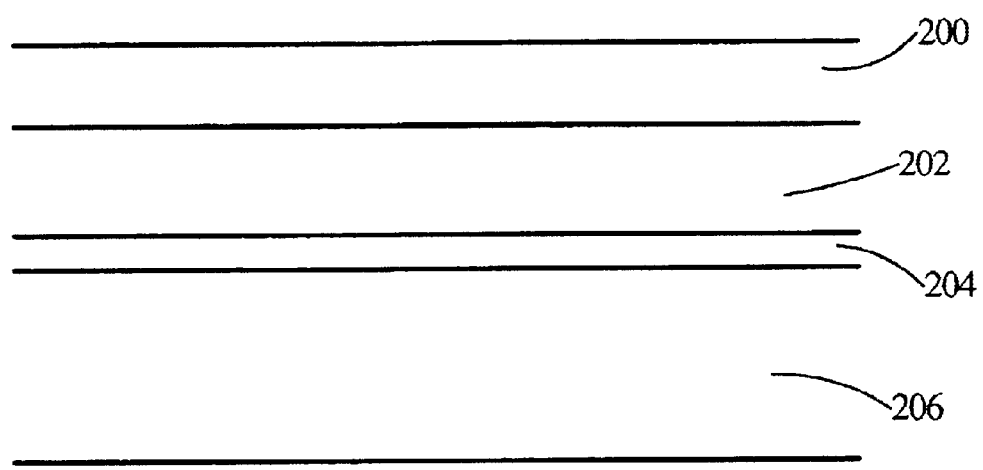
FIGS. 2, 3, 4, 5, 6, and 7 illustrate partial cross-sectional diagrams of the fabrication sequence of FIG. 1 for forming the notched gate structure in accordance with the present invention.
Figure 3:
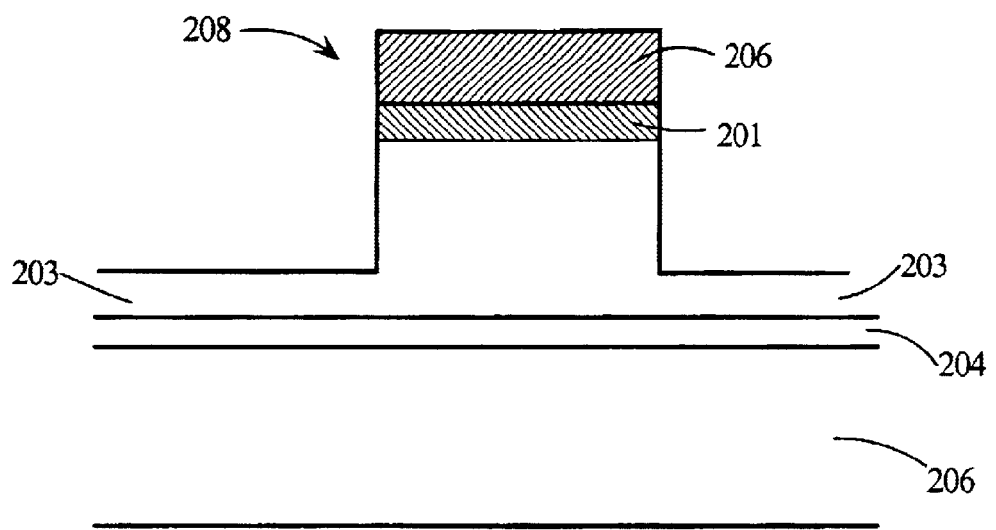

Referring to FIG. 2, the formation of spacers initiates with the application of a first layer of hard mask material 200 over a layer of gate conductor material 202 (e.g., polysilicon) that lies over an oxide layer 204 on a substrates 206, as is well understood by those skilled in the art. Once the first layer of hard mask material 200 is applied, a desired pattern of gate structure areas is formed in the layer of gate conductor material 202 and first layer of hard mask material 200 using photolithographic techniques, as presented with reference to FIG. 3.

Thus, a photoresistive mask 206, (see FIG. 3), is selectively provided over the first layer of hard mask material 200. A timed etch is then performed to remove the first layer of hard mask material 200 and a portion of the gate conductive layer 202 in areas not masked by the photoresistive mask 206. The processing conditions can be any known polysilicon etch. In this example, the etch is done on a high density plasma etch (AMAT DPS Poly) reactor. The conditions are typical for polysilicon etch: 4 mT (milliTorr) pressure, 475 W (watt) source power, 80 W bias power with flow rates in SCCM (standard cubic centimeters per minute) of 100 $HB_r$, 60 $Cl_2$, 16 $HeO_2$, and 25 $CF_4$. The cathode temperature is 50° C. The photoresistive mask 206 is then stripped off using standard techniques to leave a pattern of gate structure areas 208 having a top spacer 201 of the first layer of hard mask material and a remaining layer 203 of gate conductive material between the gate structure areas 208. The use of the timed etch capable provides the remaining layer 203 with a depth that is consistent across the wafer in support of the notch formation, as further described hereinbelow.

Figure 4:
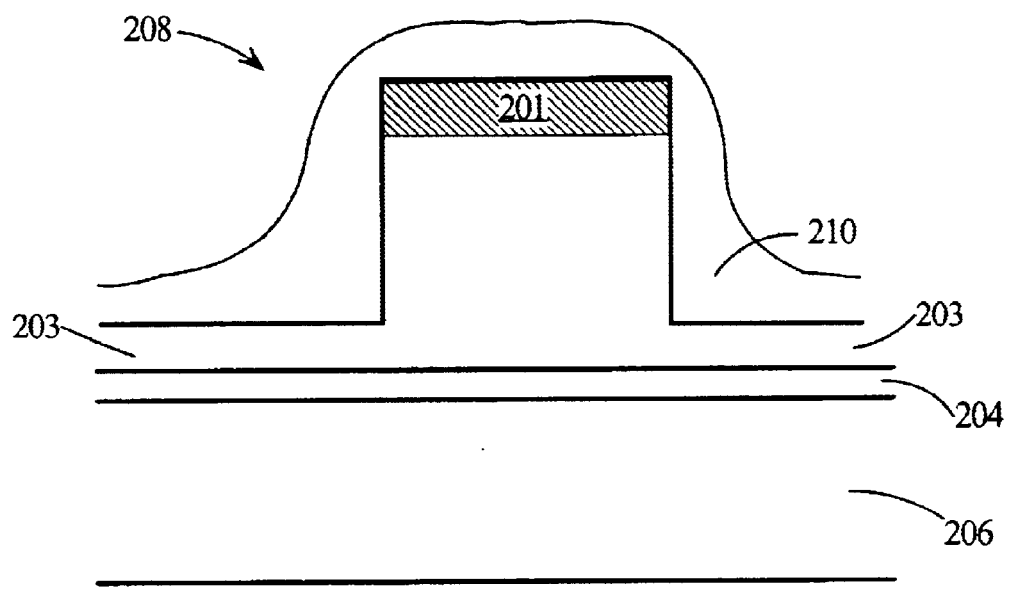
Figure 5:
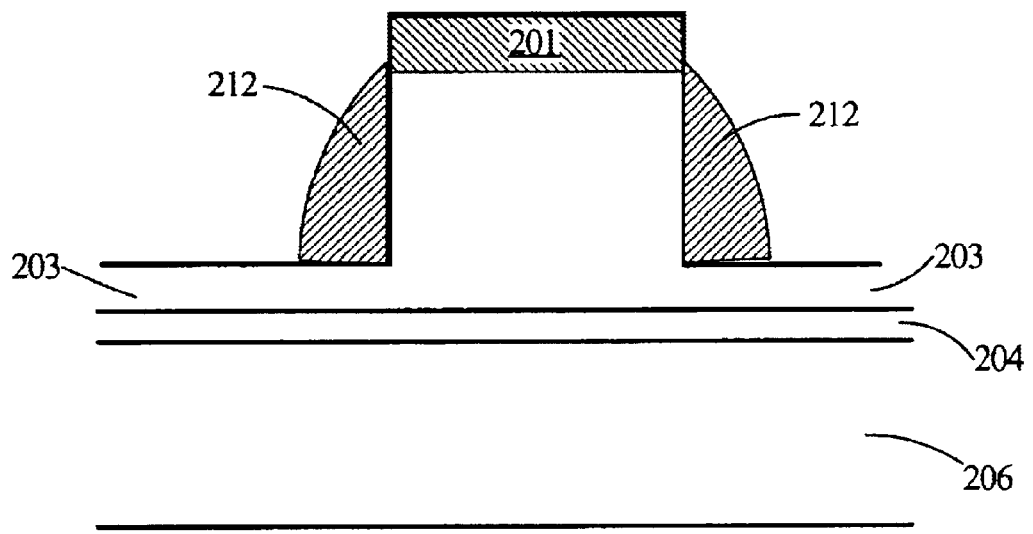
Figure 6:
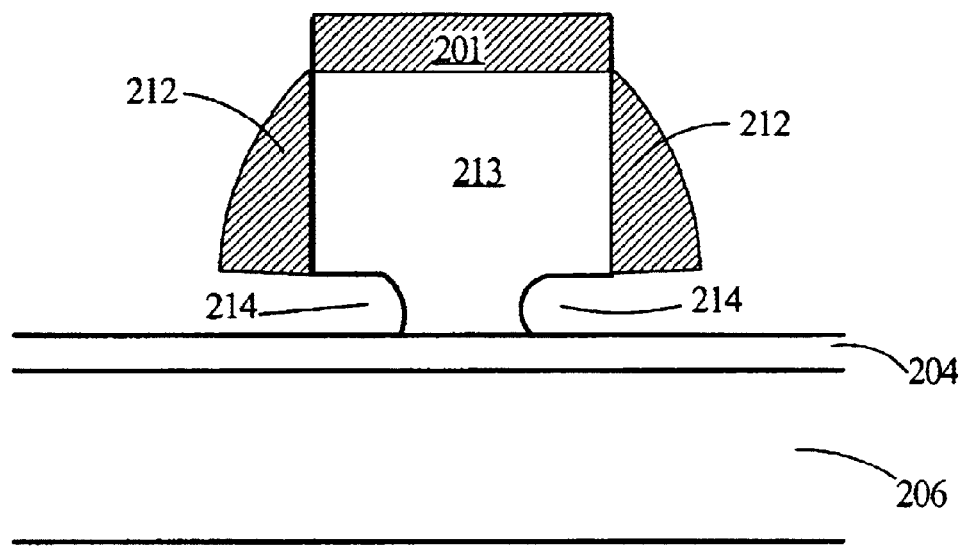

Referring now to FIG. 4, the formation of spacers continues with the application of a second layer of hard mask material 210 over the pattern of gate structure areas 208 and the remaining layer 203 of gate conductive material. An anisotropic etch follows to form side spacers 212, (see FIG. 5), from the second layer of hard mask material 210 on the gate conductors 213 in the gate structure areas 208, while maintaining the remaining layer 203 of gate conductive material between the gate structure areas 208. Any standard dielectric spacer etch conditions could be used for example: 80 T, 200 W, 50 $CF_4$, 15 HBr, 10 Gauss (AMAT MxP)

With the spacers 201 and 212 formed, the notched gate fabrication continues with performance of an isotropic etch to remove the remaining layer 203 of gate conductive material outside of the gate structure areas 208 and to form notches 214 under the side spacers 212 in the gate structure areas 208. For the isotropic etch, 15 mT, 1000 W source, 20 W bias, 160 $HB_r$, 20 $Cl_2$ (AMAT DPS) for example, are suitable etch conditions, as is well understood by those skilled in the art.

Figure 7:
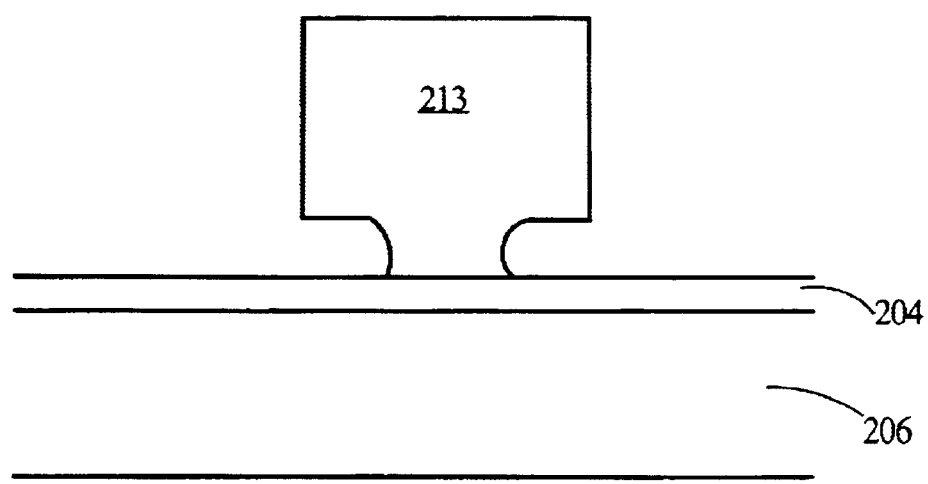

Once the notches 214 have been formed in the gate structure areas, the top 201 and side spacers 212 are stripped using standard technique to leave gate conductor 213 as a notched gate structure, as shown by FIG. 7. With the notched gate structure fabrication in accordance with the present invention, smaller dimensions are achieved at bottom contact point of a gate. Thus, the physical and electrical gate length is reduced, while maintaining silicide area for the gate at a top contact point.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for fabricating a notched gate structure for a semiconductor device, the method comprising:
    forming spacers of hard mask material on a gate conductor; and
    utilizing the spacers during etching to form notches in the gate conductor and provide a notched gate structure;
    wherein forming spacers further comprises providing a first layer of hard mask material over a layer of gate conductor material and forming a desired pattern of gate structure area in the layer of gate conductor material and first layer of hard mask material;
    wherein forming a desired pattern further comprises utilizing a photoresistive mask selectively over the first layer of hard mask material, performing a timed etch to remove the first layer of hard mask material and a portion of the gate conductive layer in areas not masked by the photoresistive mask, and stripping off the photoresistive mask to leave a pattern of gate structure areas having a top spacer of the first layer of hard mask material and a remaining layer of gate conductive material between the gate structure areas.

2. The method of claim 1 wherein forming spacers further comprises providing a second layer of hard mask material over the pattern of gate structure areas and the remaining layer of gate conductive material.

3. The method of claim 2 further comprising performing an anisotropic etch to form side spacers from the second layer of hard mask material on the gate conductors in the gate structure areas.

4. The method of claim 3 further comprising performing an isotropic etch to remove the remaining layer of gate conductive material and to form notches under the side spacers in the gate structure areas.

5. The method of claim 4 further comprising removing the top and side spacers to leave a notched gate structure.

6. A method for fabricating a notched gate structure for a semiconductor device, the method comprising:
    performing a timed etch of masked gate conductive material to maintain a portion of a gate conductive layer and provide gate structure areas in the gate conductive layer;
    anisotropically etching the gate structure areas to provide spacers on the gate structure areas; and
    isotropically etching the portion of the gate conductive layer to provide notched gates in the gate structure areas.

7. The method of claim 6 further comprising forming masked gate conductive material by providing a first layer of hard mask material over the gate conductive layer and providing a photoresistive mask selectively over the first layer of hard mask material.

8. The method of claim 7 further comprising providing a second layer of hard mask material over the portion of the gate conductive layer and gate structure areas prior to anisotropically etching the gate structure areas.

9. The method of claim 8 wherein anisotropically etching provides spacers of the first layer of hard mask material on a top of the gate structure areas and spacers of the second layer of hard mask material on each side of the gate structure areas.

10. The method of claim 6 further comprising stripping the spacers from the notched gates.

* * * * *